United States Patent
Kawahito

(10) Patent No.: US 7,436,496 B2
(45) Date of Patent: Oct. 14, 2008

(54) DISTANCE IMAGE SENSOR

(75) Inventor: Shoji Kawahito, Hamamatsu (JP)

(73) Assignee: National University Corporation Shizuoka University, Shizuoka-shi (JP)

(*) Notice: Subject to any disclaimer, the term of this patent is extended or adjusted under 35 U.S.C. 154(b) by 113 days.

(21) Appl. No.: 10/537,960

(22) PCT Filed: Jan. 28, 2004

(86) PCT No.: PCT/JP2004/000767

§ 371 (c)(1),
(2), (4) Date: Mar. 1, 2006

(87) PCT Pub. No.: WO2004/070313

PCT Pub. Date: Aug. 19, 2004

(65) Prior Publication Data

US 2006/0192938 A1    Aug. 31, 2006

(30) Foreign Application Priority Data

Feb. 3, 2003 (JP) ............................. 2003-025609
May 12, 2003 (JP) ............................. 2003-132945

(51) Int. Cl.
*G01C 3/08* (2006.01)
(52) U.S. Cl. ..................................... 356/5.01
(58) Field of Classification Search ....... 356/5.01–5.15, 356/3.01–3.15, 4.01–4.1, 6–22, 28, 28.5

See application file for complete search history.

(56) References Cited

U.S. PATENT DOCUMENTS 4,681,432 A * 7/1987 Kawabata et al. .......... 356/4.04

(Continued)

FOREIGN PATENT DOCUMENTS

JP          11-316645          11/1999

(Continued)

OTHER PUBLICATIONS

Office Action dated Mar. 11, 2008 issued in corresponding Japanese Application No. 2003-132945.

(Continued)

*Primary Examiner*—Thomas H. Tarcza
*Assistant Examiner*—Luke D Ratcliffe
(74) *Attorney, Agent, or Firm*—Westerman, Hattori, Daniels & Adrian, LLP.

(57) ABSTRACT

A distance image sensor for removing the background light and improving the charge transfer efficiency in a device for measuring the distance to an object by measuring the time-of-flight of the light.

In a distance image sensor for determining the signals of two charge storage nodes which depend on the delay time of the modulated light, a signal by the background light is received from the third charge storage node or the two charge storage nodes in a period when the modulated light does not exist, and is subtracted from the signal which depends on the delay time of the two charge storage nodes, so as to remove the influence of the background. Also by using a buried diode as a photodetector, and using an MOS gate as gate means, the charge transfer efficiency improves. The charge transfer efficiency is also improved by using a negative feedback amplifier where a capacitor is disposed between the input and output.

16 Claims, 15 Drawing Sheets

U.S. PATENT DOCUMENTS 4,864,515 A * 9/1989 Deck .......................... 702/142
6,794,214 B2   9/2004 Berezin et al.
2001/0022653 A1 * 9/2001 Seo ........................... 356/5.01

FOREIGN PATENT DOCUMENTS

JP          2001-281336        10/2001
JP          2002-368205 A      12/2002

OTHER PUBLICATIONS

Hirai et al. "A Vision Chip with the Function for Detecting Modulated Light" - 2001 ITE Annual Convention - Aug. 2001.

Office Action dated Jun. 13, 2008 issued in corresponding Japanese Application No. 2003-132945.

* cited by examiner

(a) n channel MOS transistor

(b) CMOS type switch

DISTANCE IMAGE SENSOR

TECHNICAL FIELD

The present invention relates to a technology for measuring the distance to an object by emitting a light to an object, receiving the light reflected from the object, and measuring the delay time, using the fact that the velocity of the light is a known.

BACKGROUND ART

The velocity of light is $3 \times 10^8$ m/s. Since this is known, the distance to an object can be measured by emitting light, receiving the light reflected from the object, and measuring the delay time. The TOF (Time-Of-Flight) method is a method for measuring the distance to an object by measuring the time of the flight of the light. Table 1 shows the relationship between the resolution of the measurement of the delay time and the resolution of the distance.

TABLE 1

Relationship between delay time measurement resolution and distance resolution based on the TOF method

| Delay time measurement resolution | Measurement distance resolution |
| --- | --- |
| 10 μs | 1.5 km |
| 1 μs | 150 m |
| 100 ns | 15 m |
| 10 ns | 1.5 m |
| 1 ns | 15 cm |
| 100 ps | 1.5 cm |
| 10 ps | 1.5 mm |
| 1 ps | 0.15 mm |

According to Table 1, the distance measurement range with respect to the delay time measurement range can be read along with the distance measurement resolution, and if an equipment of which the delay time measurement range is 1 μs and the delay time measurement resolution is 1 ns could be available, then a 150 m range can be measured with a 15 cm resolution, and the equipment can be used as an on-vehicle distance sensor.

Three related prior arts have been reported.
(1) Inventor: Cyrus Bemji, Assignee: Canesta Inc. "CMOS-Compatible Three-dimensional Image Sensor", U.S. Pat. No. 6,323,942 B1, Nov. 27, 2001
(2) R. Lange, P. Seitz, A. Biber, S. Lauxtermann, "Demodulation pixels in CCD and CMOS technologies for time-of-flight ranging", Proceedings of SPIE, Vol. 3965, pp. 177 - 188, (2000)
(3) Ryohei Miyagawa, Takeo Kanade, "CCD-based range-finding sensor", IEEE Trans. Electron Devices, Vol. 44, No. 10, pp. 1648-1652 (1997)

Method (1) concerns projecting a pulse light, shaping the waveform of the pulse by detecting the peak of the received signal pulse, and digitally measuring the delay time using a high-speed pulse. In this case, a sufficient brightness of light is required to generate a pulse from the received light signal, so application is limited.

Methods (2) and (3) are similar methods. Method (2) is implemented in a process where CCD and CMOS are integrated, where charges are alternately transferred to two nodes at high-speed synchronizing with a high frequency modulated light of 20 MHz, using the charge transfer of CCD, and measurement is performed by using the fact that the distribution ratio of the charges to two nodes depends on the delay time of the modulated light. Since a mixed process of CCD and CMOS is required, cost is high.

Method (3) concerns alternately transferring charges, generated by modulated light based on pulse modulation, to two nodes using the structure of CCD, and measurement is performed by using the fact that the distribution ratio thereof depends on the delay time of the modulated light. This also uses CCD, so special manufacturing steps are required.

DISCLOSURE OF THE INVENTION

Conventional methods for measuring the distance to an object by measuring the time of flight of the light involve either low sensitivity or have complicated manufacturing steps. And the removal of background light is not considered in any of these methods.

The present inventor devised that an improvement of the charge transfer efficiency and the charge storage (integration) can be implemented at a relatively low cost by adding a relatively simple step for a standard CMOS process or a CMOS image sensor, or by adding a circuit, and by this the distance image sensor with high sensitivity can be implemented. According to an embodiment of the present invention, this distance image sensor can be used in an ordinary environment since the influence of background light can be eliminated.

The key points of this invention are as follows.

A method for measuring a distance to an object while implementing an improvement of the charge transfer efficiency and charge storage (integration) can be roughly divided into two. One is using a device structure which is completely depleted using a buried photo-diode and transferring and storing the charges to two nodes alternately at high-speed, using the fact that the distribution ratio thereof depends on the delay time of the modulated light. The other is transferring and storing the charges generated in a photo-diode to two capacitors alternately, synchronizing modulated light, using an amplifier, without using a special device structure (cost decreases). For this, the fact that the distribution ratio thereof depends on the delay time of the modulated light, is applied.

The principle of distributing charges to two nodes using the structure of a buried photo-diode is very close to that of prior art (3). However, prior art (3) is a CCD device, so it cannot coexist with a CMOS processing circuit. The buried photo-diode is becoming a standard technology of high image quality CMOS image sensors, and can implement a distance image sensor in a CMOS structure used for the configuration of the present patent application, using a relatively low cost and high performance CMOS image sensor technology, which is an advantage.

None of the methods of the prior arts consider the removal of background light. The embodiments of the present invention, which can eliminate the influence of background light, can be used in an ordinary environment. Three methods are proposed as methods to remove background light.

(a) Three nodes (or capacitors) for charge storage are provided, a timing is selected for two of these so that the ratio of charge distribution is changed by the delay of the modulated light, and for the remaining one node the timing is set so that the modulated light is always OFF, then signals only by background light are stored. Using this, the influence of background is eliminated by subtracting components by the background from the signals including the information on the delay of the modulated light. Since this switching is performed at very high-speed, the background light is highly identical in the three nodes. But if the pixel circuit becomes slightly more complicated, the influence of dark current remains, which is a problem.

(b) Only two charge storage nodes (or capacitors) are provided. Considering the fast reading of the image, fast speed images are further divided into two time zones. In the first time zone the modulated light is projected and the signals of the two charge storage nodes (signals which depend on the delay of the modulated light) are fetched, and in the latter time zone the modulated light is turned OFF and the signals of the two charge storage nodes generated only by the background light are fetched. The influence of the background light can be eliminated by processing these signals. However if the background changes between the two time zones, the influence of background may not be completely eliminated. Still finally the average value of the values which were read and calculated at high-speed is determined, so the influence of the background light can be decreased by this processing.

(c) The difference of the signals of the two charge storage nodes which depend on the delay time of the modulated light is determined, and is amplified by an integrator, and is supplied as the control voltage of the voltage control delay circuit. The timing of the charge transfer to the two charge storage nodes is controlled by the output pulse of the delay circuit and is used as a negative feedback circuit, so that the signals of the two charge storage nodes become the same. At this time, the fact that the output voltage of the integrator depends on the delay time is used. In this case, this circuit directly measures the delay time only by the difference of the two nodes, where the delay by the background is subtracted, so the influence of the background is automatically eliminated. Circuits however become complicated.

Each method has an advantage and a disadvantage.

BEST MODE FOR CARRYING OUT THE INVENTION

Figure 2:
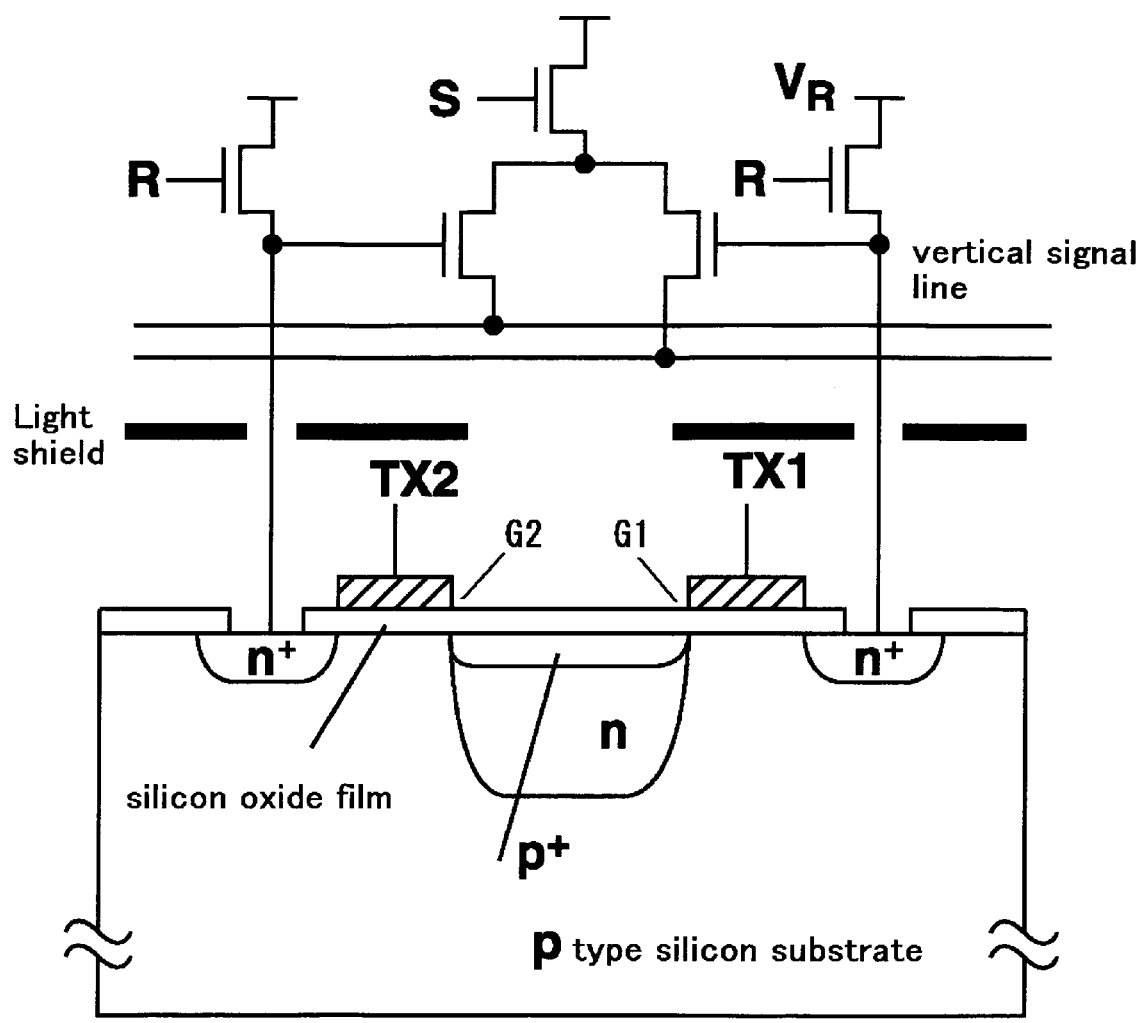
FIG. 2 is a diagram depicting the pixel structure (1) of the CMOS distance image sensor using a buried photo-diode.
Figure 3:
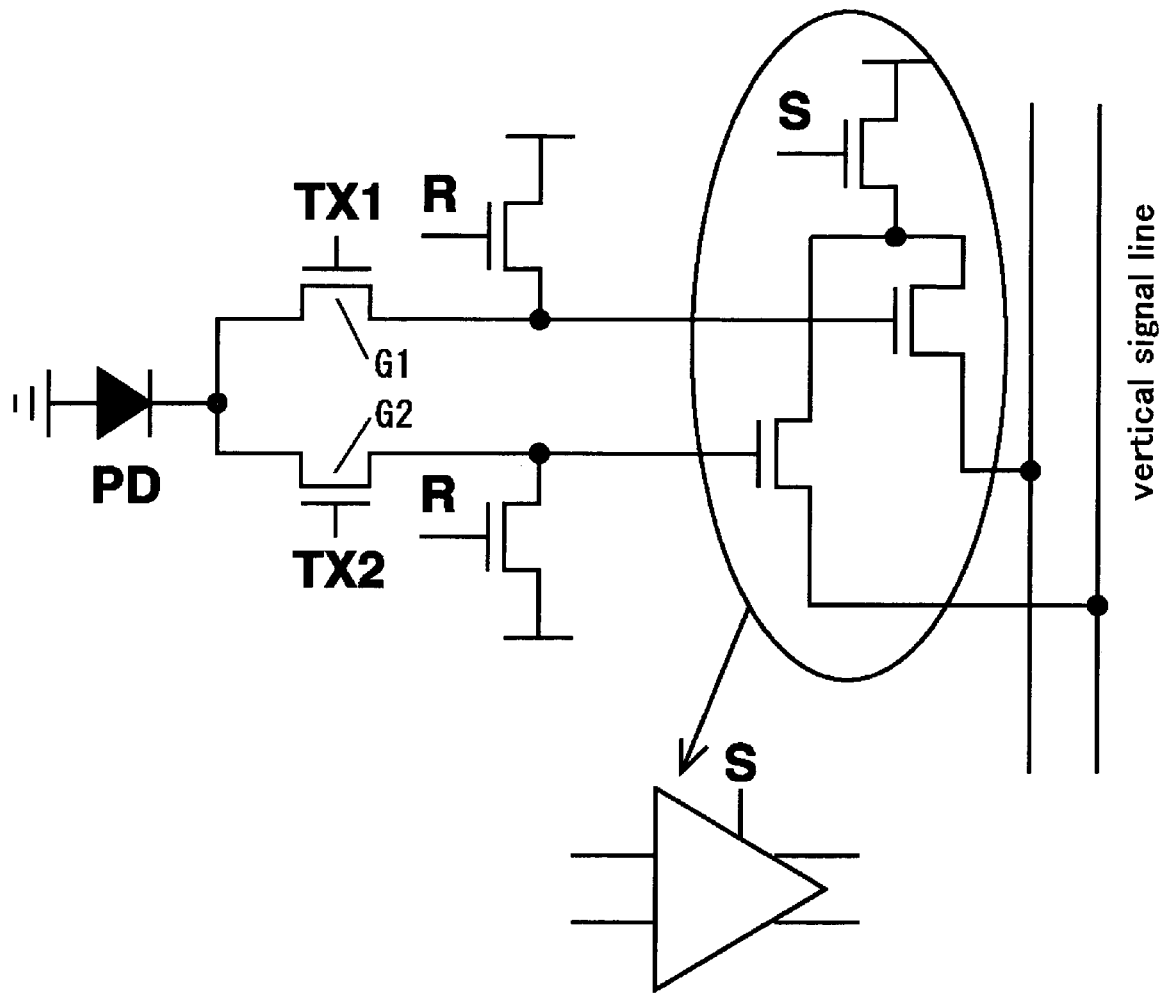
FIG. 3 is a diagram depicting an equivalent circuit having the structure shown in FIG. 2.
Figure 4:
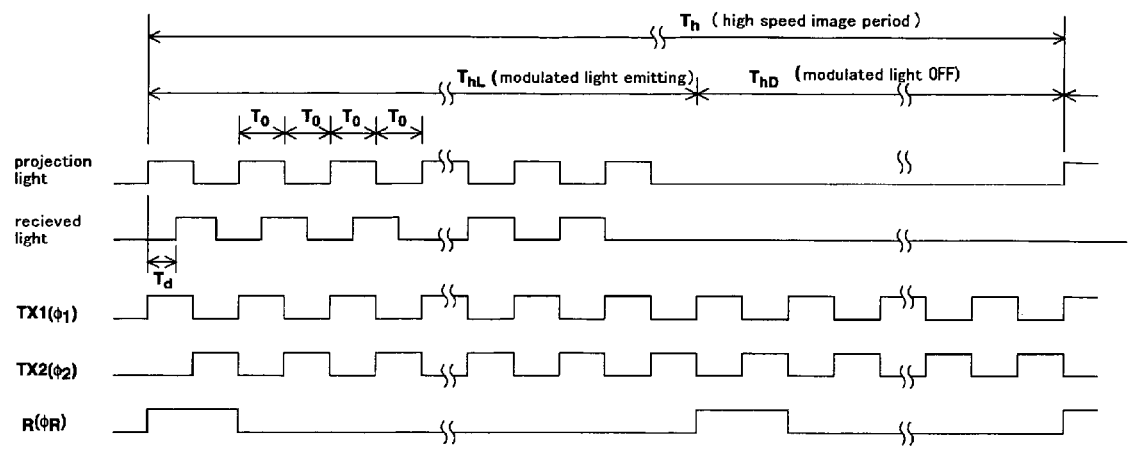
FIG. 4 is an operating timing chart (circuit in FIG. 2)

First the principle of measuring the time of flight of light while removing the background will be described using the case of the block diagram in FIG. 1 as the simplest example. This corresponds to the above mentioned principle (b). FIG. 2 is a diagram depicting the structure of each pixel, and FIG. 3 shows the equivalent circuit thereof. FIG. 4 is an operation timing chart in the circuit of each pixel. The cycle of acquiring an image at high-speed is assumed to be Th. This cycle is divided into the period Th L for projecting the pulse modulated light, and the period Th D for turning the modulated light OFF. In the period when the modulated light is projected, the light source is driven by a repeat pulse having a predetermined cycle, and emits light. This light is irradiated onto an object. The image by the reflected light thereof is formed on the distance image sensor via the lens.

Each pixel has a buried photo-diode, and the stored charges are alternately transferred and stored to the two diffusion layers (n+) alternately by the gate structure (G1, G2) of the control signal line TX1 (hereafter "TX1"), and the control signal line TX2 (hereafter "TX2") to which control signals from the control section, which is not illustrated, are supplied. At this time, the buried photo-diode is formed such that the n-type region is completely depleted when high voltage is applied to TX1 or TX2. By this the charges are transferred at high-speed. Since the resolution of the measurement of the flight time of light increases as the frequency of the modulated light is higher, TX1 and TX2 must be controlled at 1 MHz or higher frequency, and a high-speed charge transfer is indispensable. By this structure the charge transfer efficiency improves.

If there is no delay, the timing of the opening TX1 and the timing of the irradiation of the light source perfectly match, and charges are transferred only to TX1. If the arrival of the modulated light delays, a part of the charges are transferred to the TX2 side. It is assumed that the time width, when the light source is emitting, is To (time width when the light source is not emitting is also To), the delay time of the light source is Td, the photo-electric current generated by the modulated light is Ip, the photo-electric current generated by the background light is Ib, and the dark current generated by the two charge storage nodes is Id1 and Id2 respectively. In addition, it is assumed that the conversion gain from charge to voltage is Gc, and the number of times of the charge transfer until a signal is acquired is N, then the signal voltages V1 and V2 at each node are given as follows.

$$V1 = Gc \cdot N(Ip(To-Td) + Id1 \cdot 2To + Ib \cdot To) \quad (1)$$

$$V2 = Gc \cdot N(Ip \cdot Td + Id2 \cdot 2To + Ib \cdot To) \quad (2)$$

Now the modulated light is turned OFF, and the voltages of the two nodes when the same processing is performed for the same time are assumed to be V1' and V2'. At this time $$V1'=Gc \cdot N(I_{d1} \cdot 2To + Ib \cdot To) \quad (3)$$

$$V2'=Gc \cdot N(I_{d2} \cdot 2To + Ib \cdot To) \quad (4)$$

Here if $$A=V1+V2, B=V1'+V2', C=V1-V1', D=V2-V2' \quad (5)$$

then $$A-B=Gc \cdot N \cdot Ip \cdot To \quad (6)$$

$$D-C=Gc \cdot N \cdot Ip(2Td+To) \quad (7)$$

and these do not include the dark current and the components of background. Using Expression (6) and Expression (7) the time-of-flight of the pulse light can be calculated as follows.

[Expression 8]

$$T_d = \frac{1}{2} T_0 \left( 1 + \frac{D-C}{A-B} \right) \quad (8)$$

As FIG. 4 shows, this time-of-flight is calculated at the cycle of acquiring one high-speed image. This time is calculated by weak signals, so it is influenced by noise, and by averaging the values of many frames, the influence of noise can be decreased and precision can be increased. Averaging M times of calculation results is given by the following expression.

[Expression 9]

$$T_d = \frac{T_0}{2} + \frac{T_0}{2M} \sum_{i=1}^{M} \left( \frac{D_i - C_i}{A_i - B_i} \right) \quad (9)$$

Here, Ai, Bi, Ci and Di are the values of the above mentioned A, B, C and D in the i-th high-speed frame.

Figure 5:
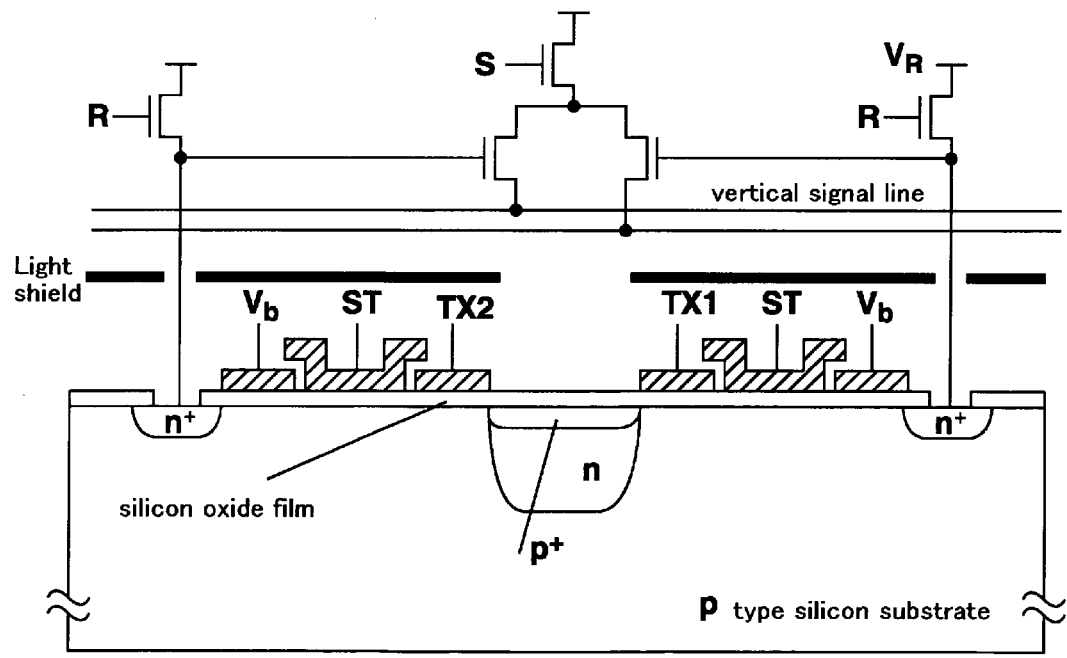
FIG. 5 is a diagram depicting the pixel structure (2) of the CMOS distance image sensor.

In the case of FIG. 2, the charge storage node is n+, and the reset noise generated in this portion cannot be removed, so the noise level increases and the dark current is also high. Even if the dark current is removed by the above processing, the shot noise by the dark current cannot be removed, which increases noise. Therefore using the structures of only one stage of CCD where TX is opened, as shown in FIG. 5, first, charges are stored directly under the electrode of the control signal line ST once, and the charges are transferred to n+ and read during reading, then these problems are solved. However the structure becomes complicated, so manufacturing cost increases.

Figure 6:
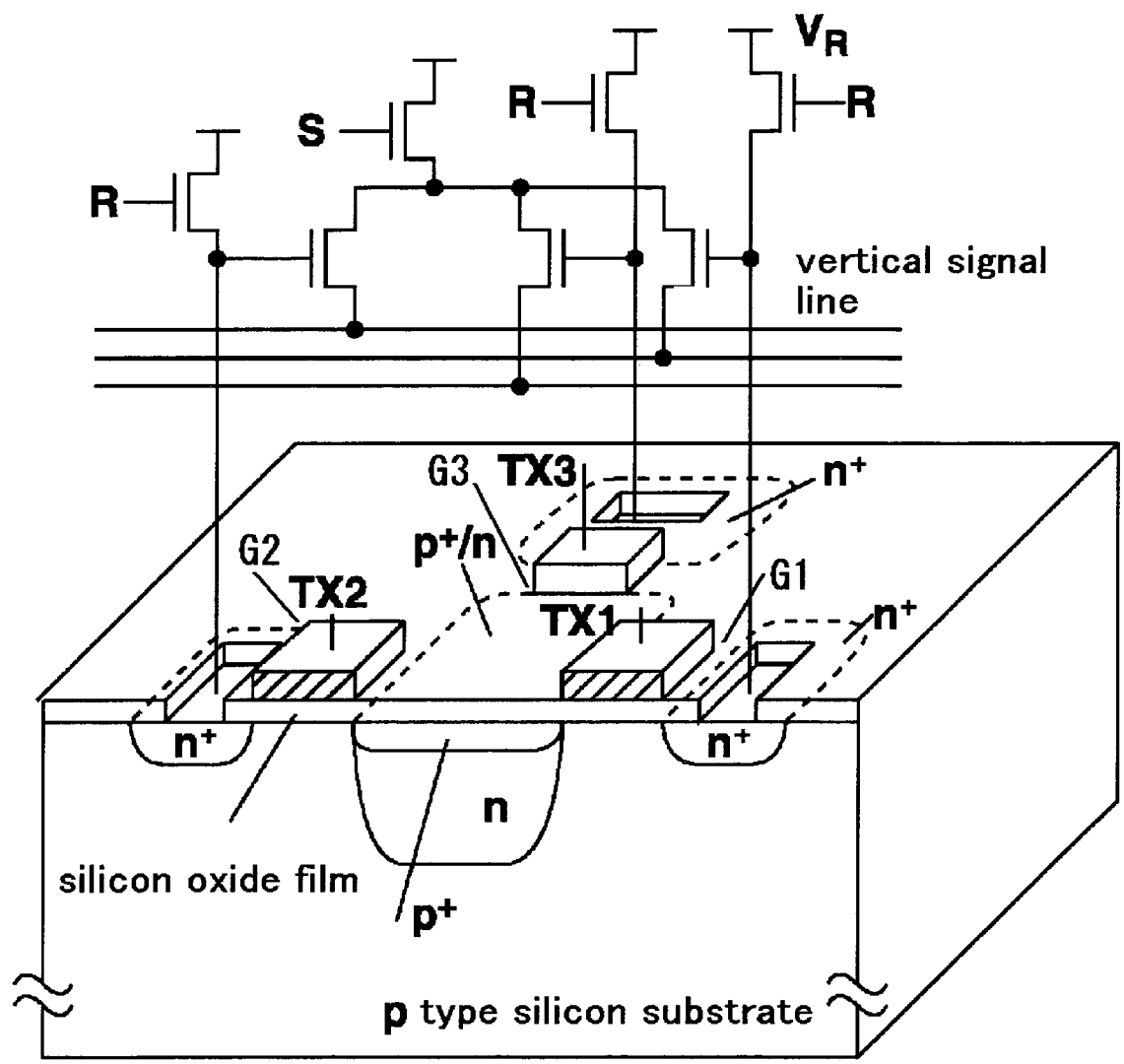
FIG. 6 is a diagram depicting the pixel structure (3) of the CMOS distance image sensor (background light removal)
Figure 7:
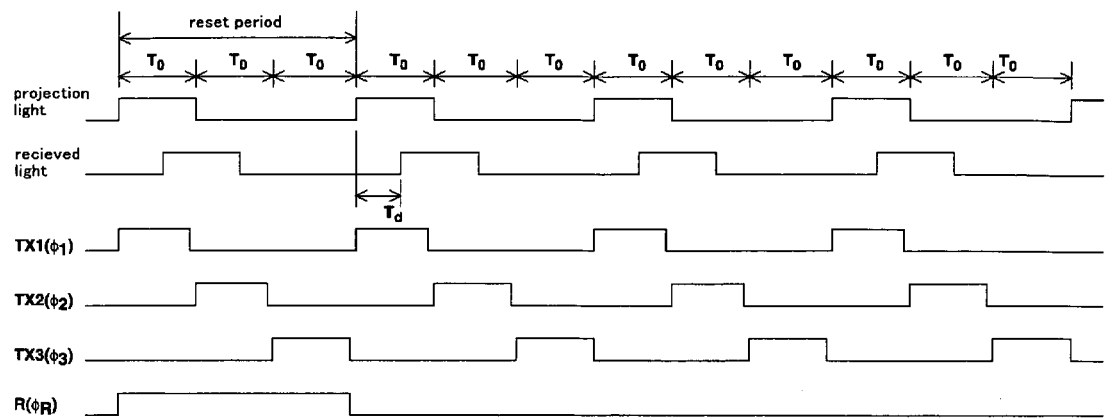
FIG. 7 is an operation timing chart when the structure shown in FIG. 6 is used.

Now the removal of the background light and the measurement principle of the time-of-flight of the light in a structure where three TXs for charge transfer exist, as shown in FIG. 6, will be described. FIG. 7 shows the timing chart thereof.

As FIG. 7 shows, the signal components related to the delay time of the modulated light are fetched to one of the three nodes, and only the changes at the timing when the modulated light is not emitting are fetched to the third storage node. If the dark currents are Id1, Id2 and Id3 respectively, the signal voltage at the third charge storage node is V3, and then the following expressions are established.

$$V1=Gc \cdot N(Ip(To-Td)+Id1 \cdot 3To+IbTo) \quad (10)$$

$$V2=Gc \cdot N(IpTd2+Id2 \cdot 3To+IbTo) \quad (11)$$

$$V3=Gc \cdot N(Id3 \cdot 3To+IbTo) \quad (12)$$

This method, where the dark current cannot be removed, is used when the dark current causes no problems. So the terms of the dark current is ignored here. If A=V2+V1 and B=V2−V1, then Td is determined as follows.

[Expression 13]

$$T_d = \frac{T_0}{2} \left( 1 - \frac{B}{A - 2V_3} \right) \quad (13)$$

Now the method for performing charge storage depending on the delay of the modulated light using charge transfer by amplifier negative feedback will be described.

Figure 8:
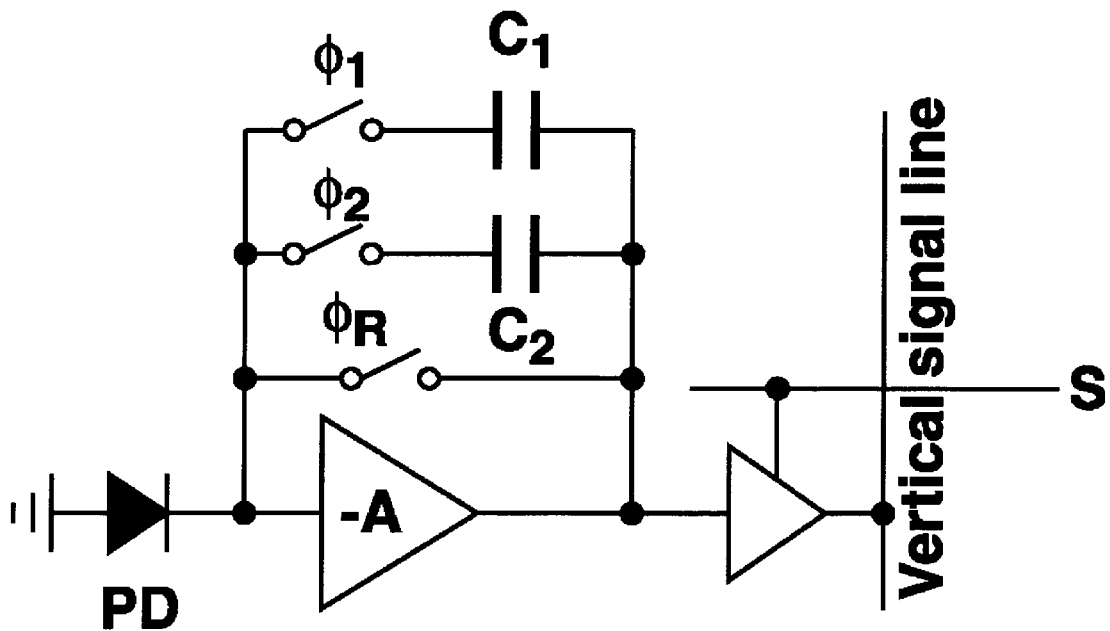
FIG. 8 is a diagram depicting the modulated light delay time-dependent charge voltage conversion circuit using the charge transfer by amplifier negative feedback.

FIG. 8 shows an amplifier negative feedback type circuit using an inversion amplifier having gain A.

The operation timing thereof is the same as FIG. 4. $\phi 1$ and $\phi 2$ are clocks which do not overlap with each other. By turning the switches ON by $\phi 1$ and $\phi 2$ while turning the switch ON by $\phi R$ first, the charges of C1 and C2 are reset. Then synchronizing the frequency of the pulse modulated light, $\phi 1$ and $\phi 2$ are alternately turned ON. At this time, the charges Q1 and Q2, transferred to C1 and C2, have the following relationship.

$$Q1=Ip(To-Td)+Id1 \cdot 2To+Ib \cdot To \quad (14)$$

$$Q2=Ip \cdot Td+Id2 \cdot 2To+Ib \cdot To \quad (15)$$

If this is repeated N times and if the output of the amplifier is observed, the voltages V1 and V2 when C1 and C2 are connected to the amplifier become as follows.

[Expression 16]

$$V_1 = \frac{1}{C_1} N(I_p(T_0 - T_d) + I_{d1} 2T_0 + I_b T_0) \quad (16)$$

[Expression 17]

$$V_2 = \frac{1}{C_2} N(I_p T_d + I_{d2} 2T_0 + I_b T_0) \quad (17)$$

In other words this operation is based on the same principle (FIG. 2) of the above described one using a buried photodiode, so the time-of-flight of the pulse modulated light (delay time) can be calculated and background can also be removed by similar processing.

Figure 9:
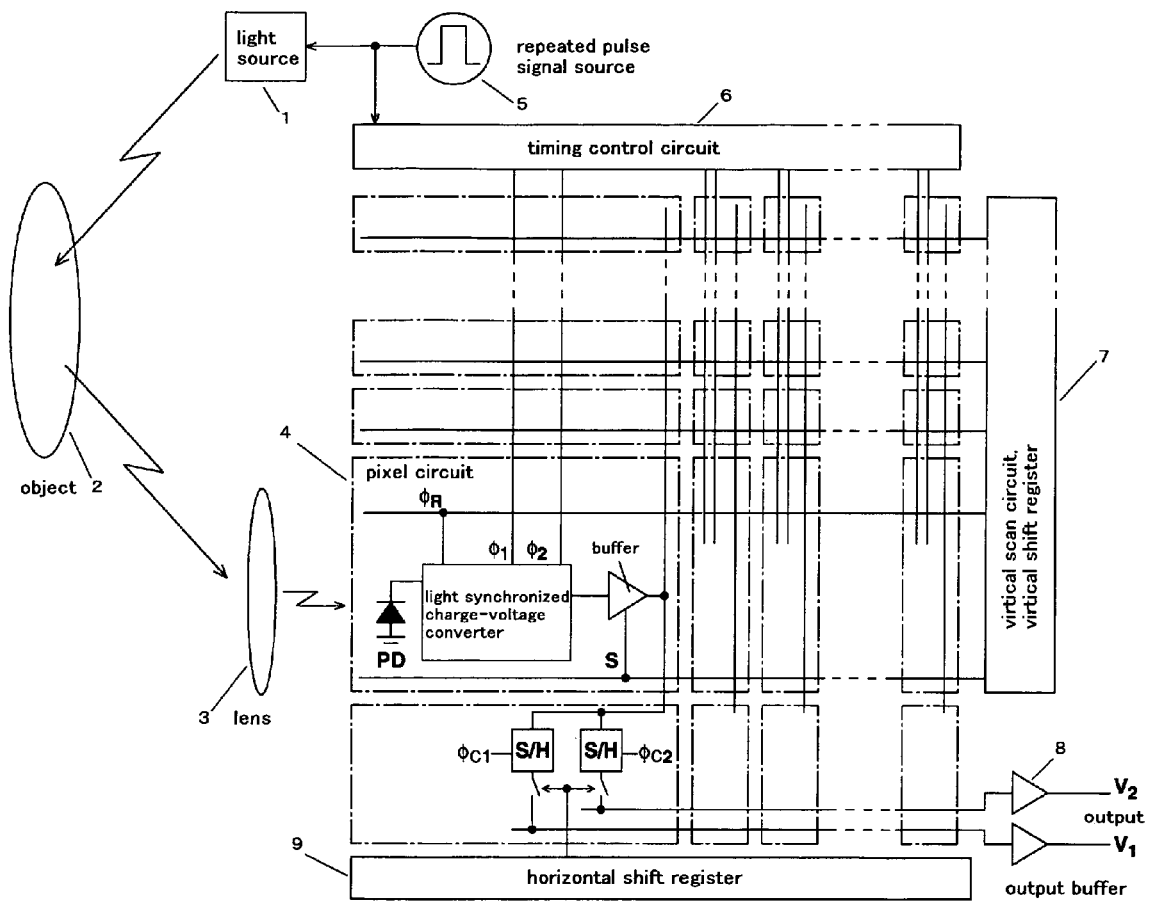
FIG. 9 is a block diagram depicting the entire configuration of the distance image sensor using charge transfer by amplifier negative feedback.

The configuration of the entire distance image sensor using FIG. 8 as the pixel circuit is shown in FIG. 9.

Figure 10:
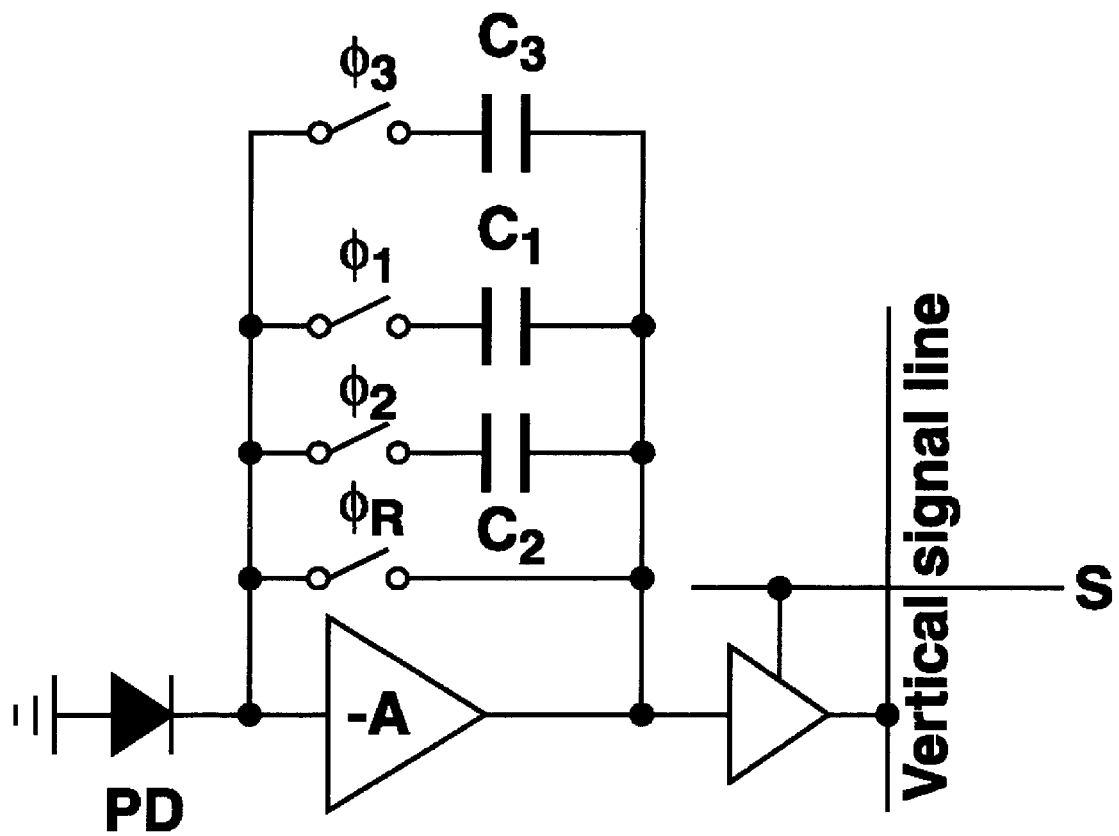
FIG. 10 is a diagram depicting the configuration when the capacitor (C3) for storing background signals is added to FIG. 8.

Also as FIG. 10 shows, a switch controlled by $\phi 3$ is connected in serial with C3, and is controlled such that charges only by the background when the pulse modulated light is not being emitted are stored in C3 at a timing the same as FIG. 7. By this, using the same principle as FIG. 6, the time-of-flight of the pulse modulated light can be calculated while removing the background light.

By using the charge transfer based on the amplifier negative feedback, the transfer efficiency of photo-charges generated in the photo-detector improves.

When the distance to an object, which moves relatively at high-speed, is measured, or when the distance image sensor itself is used on a moving body, such as the case of an on-vehicle sensor, the distance must be measured for all the pixels simultaneously. For this, the circuit in FIG. 11, which is the circuit in FIG. 8 or in FIG. 10 where a sample & hold circuit is connected to the output of the negative amplifier, is use.

Now the principle of the distance image sensor where the influence of the background is removed using the delay synchronization loop will be described.

Figure 12:
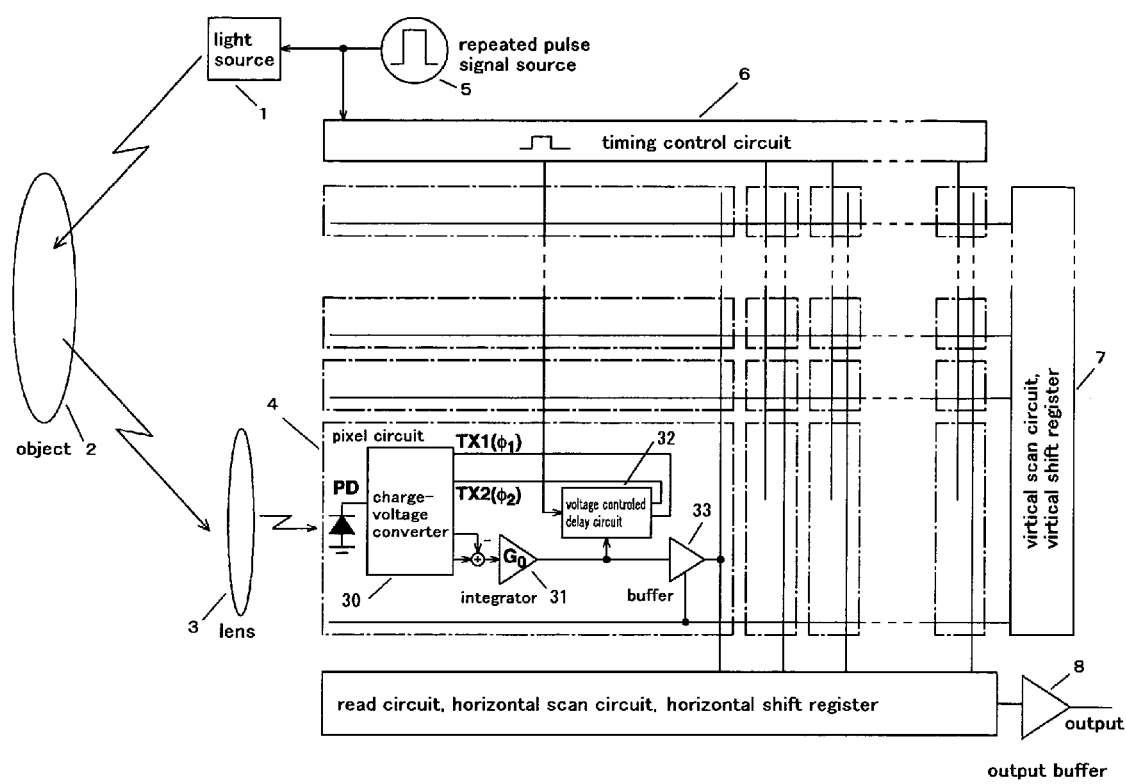
FIG. 12 is a block diagram depicting the background removal distance image sensor using the voltage control delay circuit.

FIG. 12 shows the block diagram thereof. The pixel circuit (4) is comprised of a photo-diode (PD), charge voltage conversion circuit (30), integrator (31), voltage control pulse delay circuit (32) and buffer amplifier (33) for voltage reading. In the charge voltage conversion circuit (30), a circuit to which only a current source load is connected, instead of outputting voltage to the vertical signal line using the buried photo-diode in FIG. 2 or FIG. 5, or the circuit in FIG. 8 from which the output buffer is removed, is used.

Figure 13:
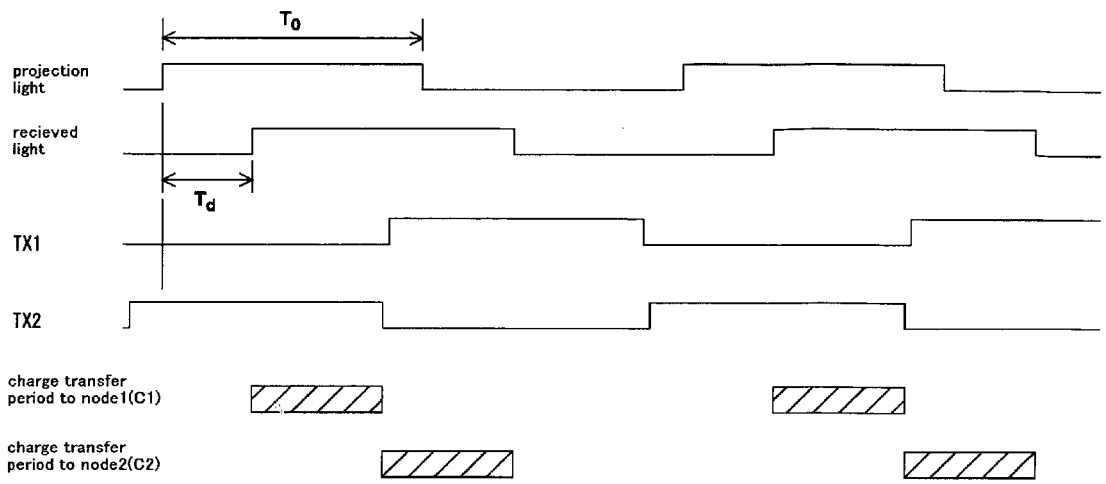
FIG. 13 is an operation timing chart of the processing of each pixel.

Since the basic principle is the same, the case when the current source load is connected to the circuit in FIG. 2, as the charge voltage conversion circuit, will be described. The value when the difference of the two outputs is determined is sampled at every predetermined time, and is supplied to the integrator. After sampling, the signal charges of the charge voltage conversion circuit are reset. This integrator is required for stabilizing the delay synchronization loop. By the output of the integrator, the pulse delay time of the voltage control delay circuit is controlled. By the output pulses, the signals for controlling TX1 and TX2 for charge transfer are generated. FIG. 13 shows the operation timing chart.

When the delay time of the modulated light is long, the output of the charge storage node 1 increases, and the output of the charge storage node 2 decreases. If the integrator integrates the value of subtracting the output voltage of the node 1 from the output voltage of the node 2, the output voltage of the integrator drops, and the delay of the pulse of the voltage control delay circuit controlled by this voltage increases, by which the charge transfer time of the node 1 increases and the charge transfer time of the node 2 decreases. In other words, a negative feedback loop is created.

A final balance is reached when the charge transfer time to the node 1 and the node 2 become the same, and at this time the delay of the pulse of the voltage control delay circuit synchronizes the delay amount of the pulse modulated light. Since the control voltage of the voltage control delay circuit is in proportion to the delay amount, the delay amount of the pulse modulated light can be measured by reading the control voltage thereof.

In this method, the charges Q1 and Q2 stored in the two nodes become as follows when transfer is repeated N times.

$$Q1 = N(Ip(Ts-Td) + IbTo) \quad (18)$$

$$Q2 = N(Ip(To+Td-Ts) + IbTo) \quad (19)$$

Here Ts is the delay time of the pulse by the voltage control delay circuit.

The voltage in proportion to the difference is fetched and amplified by the integrator. If the DC gain is sufficiently high, the DC output of the integrator is given by the following expression.

$$V\text{cont} = A(2Ts - 2Td - To) \quad (20)$$

The relationship of Vcont and the delay time Ts of the voltage control delay circuit is given by $$Ts = Tso - kV\text{cont} \quad (21)$$

Expression (21) is substituted for (20) and if $kA \gg 1$, then

[Expression 22]

$$V_{CONT} = \frac{A}{1+2kA}(2T_{s0} - 2T_d - T_0) \approx \frac{1}{k}(T_{s0} - T_d - T_0/2) \quad (22)$$

In other words, this control voltage directly reflects the delay time of the modulated light. And this voltage is read.

In this circuit the integrator is connected in the delay synchronization loop for stabilization, but this can be substituted by a low pass filter, as is well known.

These processing circuits can be constructed by CMOS, so they can be integrated onto the substrate of the CMOS image sensor. By this a compact distance image sensor can be constructed.

Now an example of increasing the distance resolution without increasing the repeat operation frequency of each pixel, by decreasing the width of the emission time of the projecting light, will be described.

The distance measuring resolution of the present distance image sensor is determined by light shot noise, and is given by the following expression.

[Expression 23]

$$\sigma_d \cong \frac{1}{\sqrt{N_S}} \frac{c}{4f_s} \quad (23)$$

Figure 14:
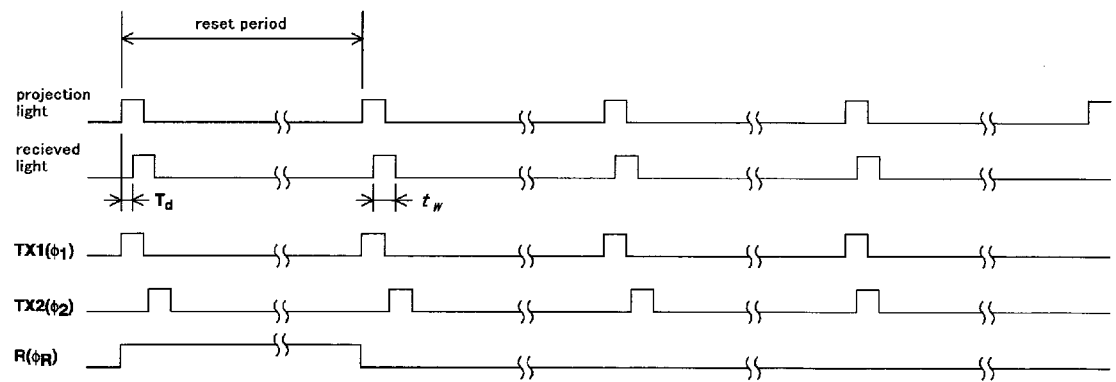
FIG. 14 is an operation timing chart (without processing to decrease the influence of background light) when short pulses are used.

Here Ns is the sum of the number of electrons stored in two capacitors, fs is the pulse frequency and c is the light velocity. The influence of background light is ignored. To improve resolution, the pulse repeat frequency must be increased. If a measurement target is in a relatively short distance, the resolution can be increased by decreasing the pulse width, instead of increasing the pulse repeat frequency. FIG. 14 shows an operation timing using short pulses when the background light removal function is not provided.

The distance resolution in this case is

[Expression 24]

$$\sigma_d \cong \frac{1}{\sqrt{N_S}} \frac{ct_W}{2} \quad (24)$$

and the distance resolution can be increased by decreasing the pulse width tw, even if the repeat frequency is not increased.

The influence of the background light can be removed by applying the timing in FIG. 14 to the operation timing shown in FIG. 4.

Figure 15:
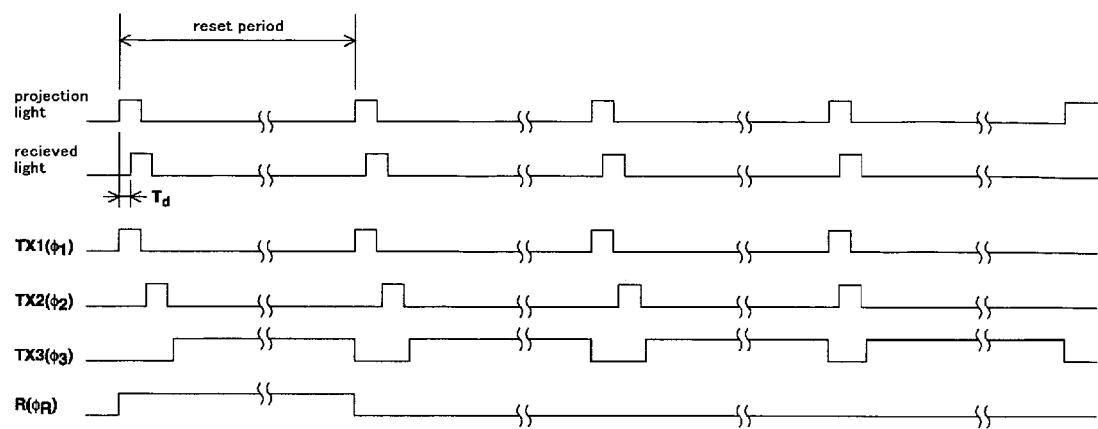
FIG. 15 is an operation timing chart (with background light removal functions) when short pulses are used.
Figure 16:
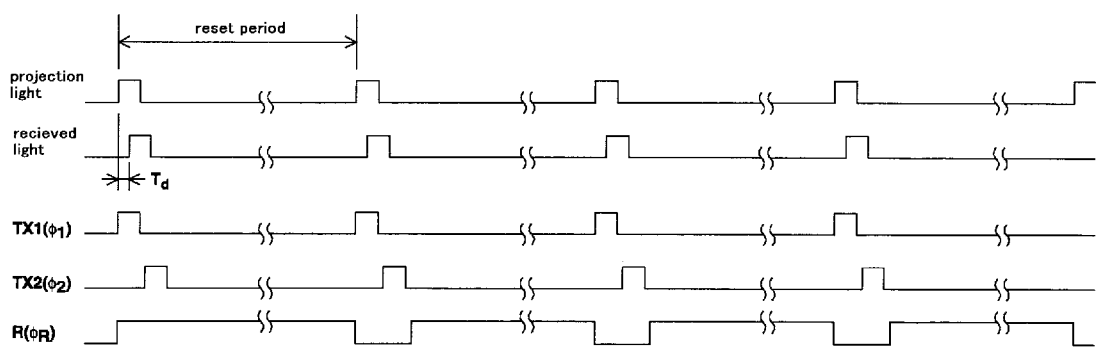
FIG. 16 is an operation timing chart (with the influence of background light decreased) using short pulses, to which a periodic reset is added.

The principle in FIG. 15 or FIG. 16 is used to remove the background light. FIG. 15 corresponds to FIG. 7, where TX3 (φ3) is set to be constant, and the emission pulse width of the projection light and TX1 (φ1) and TX2 (φ2) are decreased. The principle of removing the background light is as described above.

FIG. 16 shows that by decreasing the pulse width of the projection light, the emission intensity can be strengthened accordingly relative to the same supply power, and by turning on the reset switch of the amplifier for the period light is not emitted, background light influence can be reduced. The influence of the background light remains in a period when the pulse light is being received, but the influence thereof can be decreased if the emission intensity is sufficiently high.

Figure 17:
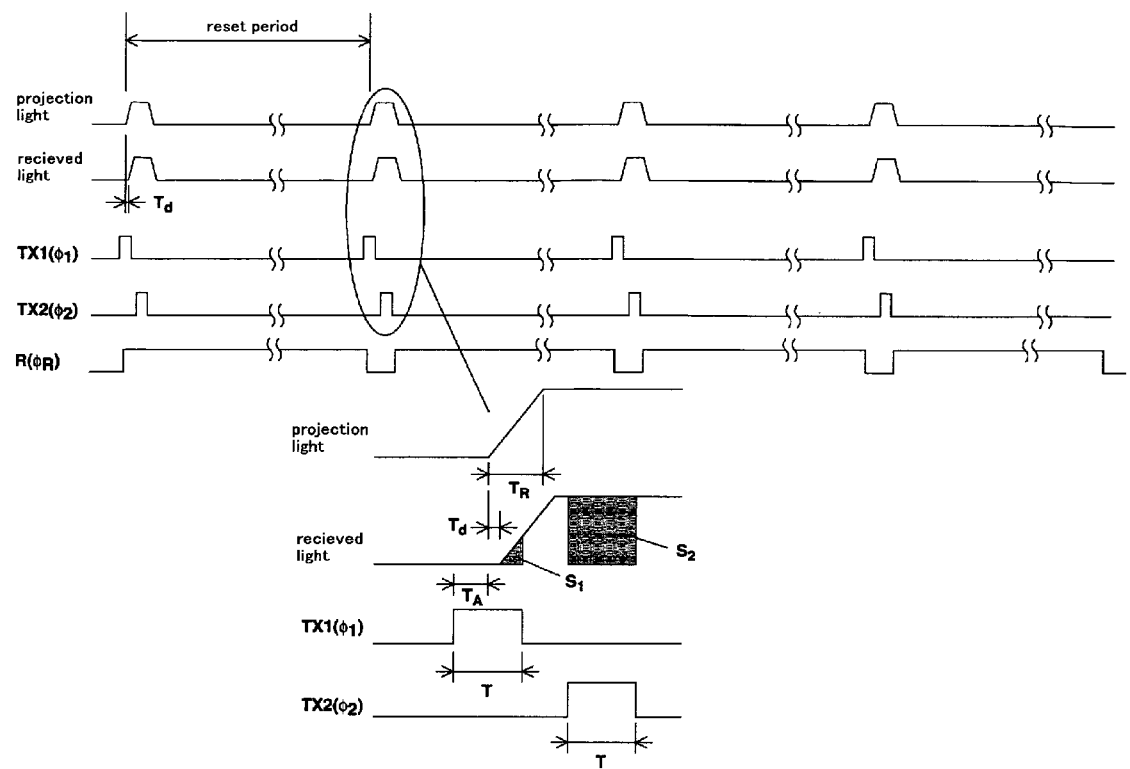
FIG. 17 is a timing chart for improving the distance measurement resolution by detecting the rise of the pulses of the received light.

The projection light and the received light in FIG. 16 show that the emission waveform in an actual LED does not rise and fall sharply but gradually at a slope, as shown in FIG. 17. So the configuration to measure the distance using the inclination of light intensity by changing the sampling width and position of signals will now be described.

Charges generated by the received light are detected with a short time width matching the rise moment of the received pulse light, and are transferred to one charge storage capacitor, and also charges generated by the received light are detected at a later time after the pulse light is completely risen and becomes constant, and are transferred to another charge storage capacitor, then the distance measurement accuracy can be improved by calculating the delay time using the ratio of the signal voltage generated by the charges stored in the two capacitors.

In order to increase the distance measurement resolution, the ratio of the change of the charges to be loaded to the capacitors, due to the delay of the signals, must be increased. In other words, the charges to be loaded regardless the delay of the signals are decreased. For this, the pulse width to load the signal charges is decreased. In this case, two conditions must be met. One is that the signal charges must be continuously changed by the delay time of the received light during the period with the width of the loaded pulse, and the other condition is that a signal value not related to the delay time can be determined as a value to be the standard, determined only by the intensity of the received light based on the combination of loaded signal charges.

To satisfy these conditions, FIG. 17 is implemented while decreasing the charge loading pulse width. In this method, charges are loaded to one capacitor while decreasing the pulse width TX1 (ϕ1). At this time, signal charges in proportion to the area in S1 in FIG. 17 are loaded. Signal charges are loaded to the other capacitor while decreasing the pulse width of TX2 (ϕ2). In this case, signal charges in proportion to the area of S1 in FIG. 17 are loaded, and even if the received light delays, signals which intensity become constant after the received pulse light completely rises, are loaded. In other words, charges depending on the delay time are loaded to one capacitor, and charges not related to the delay time are loaded to the other capacitor.

If the intensity of the received light is L, and the loading pulse width is T, then $$S_2 = T \times L \quad (25)$$

If the rise time of the pulse light is $T_R$, the lead time of the loading pulse with respect to the light transmission pulse is $T_A$, the delay time of the received light is $T_d$ and the received light has risen linearly, then

[Expression 26]

$$S_1 = \frac{1}{2} L \frac{(T - T_d - T_A)^2}{T_R} \quad (26)$$

By Expressions (25) and (26) the following expression is acquired.

[Expression 27]

$$T_d = T \left\{ 1 - \sqrt{\frac{2S_1}{S_2} \frac{T_R}{T}} \right\} - T_A \quad (27)$$

The read voltage generated by the charges stored in the two capacitors is in proportion to S1 and S2, so by calculating the ratio of the signals, the ratio of S1 and S2 can be calculated and the delay time can be measured by Expression (27).

The distance resolution in this case is approximately

[Expression 28]

$$\sigma_l = \frac{1}{4} \frac{1}{\sqrt{N_S}} cT \quad (28)$$

and by decreasing T, the resolution can be increased.

The distance resolution can be improved by reading the signals from the distance image sensor and then averaging. The resolution after M times of averaging is given by

[Expression 29]

$$\sigma_l = \frac{1}{4} \frac{1}{\sqrt{N_S \times M}} cT \quad (29)$$

By M times of averaging, the frame speed of the image decreases, but if the original frame speed to read images can be fast, then the distance image can be acquired at a frame speed sufficient as a moving image. Particularly when the resolution is low (number of pixels is small), it is easy and effective to increase the frame speed.

Using such a short emission pulse width is also useful to prevent loading signals by multiple reflection. It also can be used to prevent a distance measurement error caused by light reflected at a place far away than expected coming back at the timing of the next loading pulse. In other words, if the repeat cycle with respect to the emission pulse width is long, the pulse must be reflected at a very distant place to be loaded at the timing of the next loading pulse, and the influence of this pulse is small since the pulse has been sufficiently attenuated compared with the case of a short distance.

Acquiring distance information from the image information was described above, but according to the configuration of the present invention where the signals V1 and V2 stored in the two capacitors are acquired and the distance information is calculated from these signals, the brightness image information can be acquired as well.

In other words, if the sum of V1 in Expression (1) and V2 in Expression (2) is determined, the brightness information of the target object can be acquired. If the circuits in FIG. 6 or FIG. 9 are operated at the timing shown in FIG. 7, V3 of Expression (12) becomes the brightness signal of the background, so this itself can be used as the brightness image signal of the object, or in order to use the reflected light of the irradiated light as well, the brightness image signal may be acquired by adding all of V1 of Expression (10), V2 of Expression (11) and V3 of Expression (12).

Figure 11:
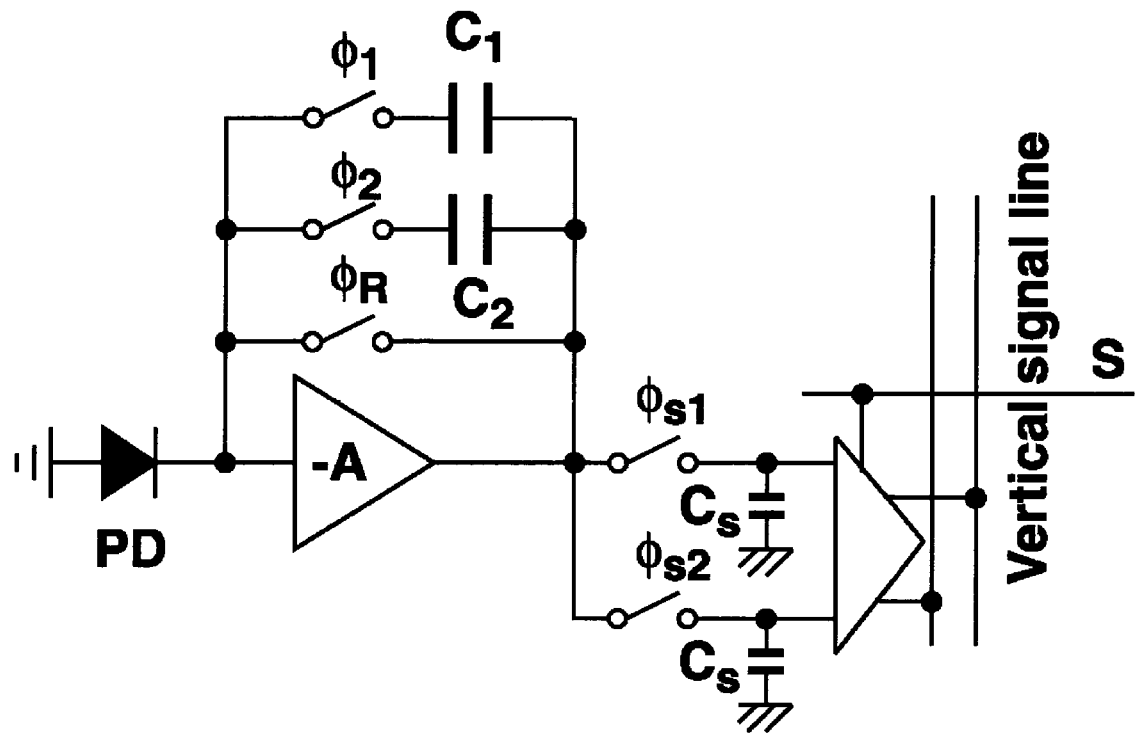
FIG. 11 is a diagram depicting the configuration where the sample & hold circuit is installed in FIG. 8 to enable simultaneous distance calculation for all pixels.
Figure 18:
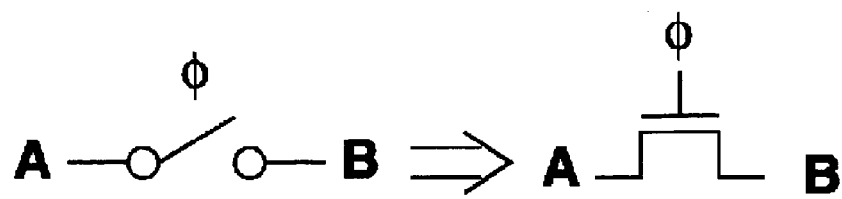
FIG. 18 are diagrams depicting switches by an MOS transistor.
Figure 18:
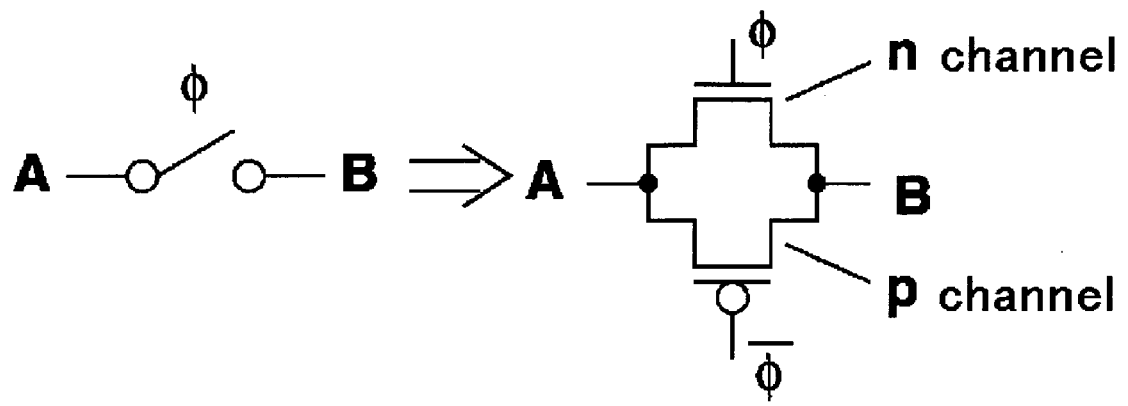

Concerning the switches, the switches used in FIG. 8, 10 and 11 operate as a gate for controlling the transfer of the charges, and for these switches, the MOS transistor shown in FIG. 8, which is connected with a photo-diode on the semiconductor substrate, are used. For this it is possible either to use an n-channel MOS transistor as shown in FIG. 18(a) (p-channel permitted) or to connect the n-channel and the p-channel MOS transistors in parallel and to supply a signal, of which logic is inverted from the control signal of the n-channel, to the p-channel as in FIG. 18(b).

Signal reading from the distance image sensor is generally the same as an ordinary CMOS image sensor. However the control signals TX1 ($\phi$1) and TX2 ($\phi$2) of the charge transfer from the photo-diode are supplied simultaneously to all the pixels and exhibit high frequency, so switching noise is generated during this period. Therefore when a signal from the pixel area is read, it is preferable to set the signal read period after these processings are completed.

Figure 1:
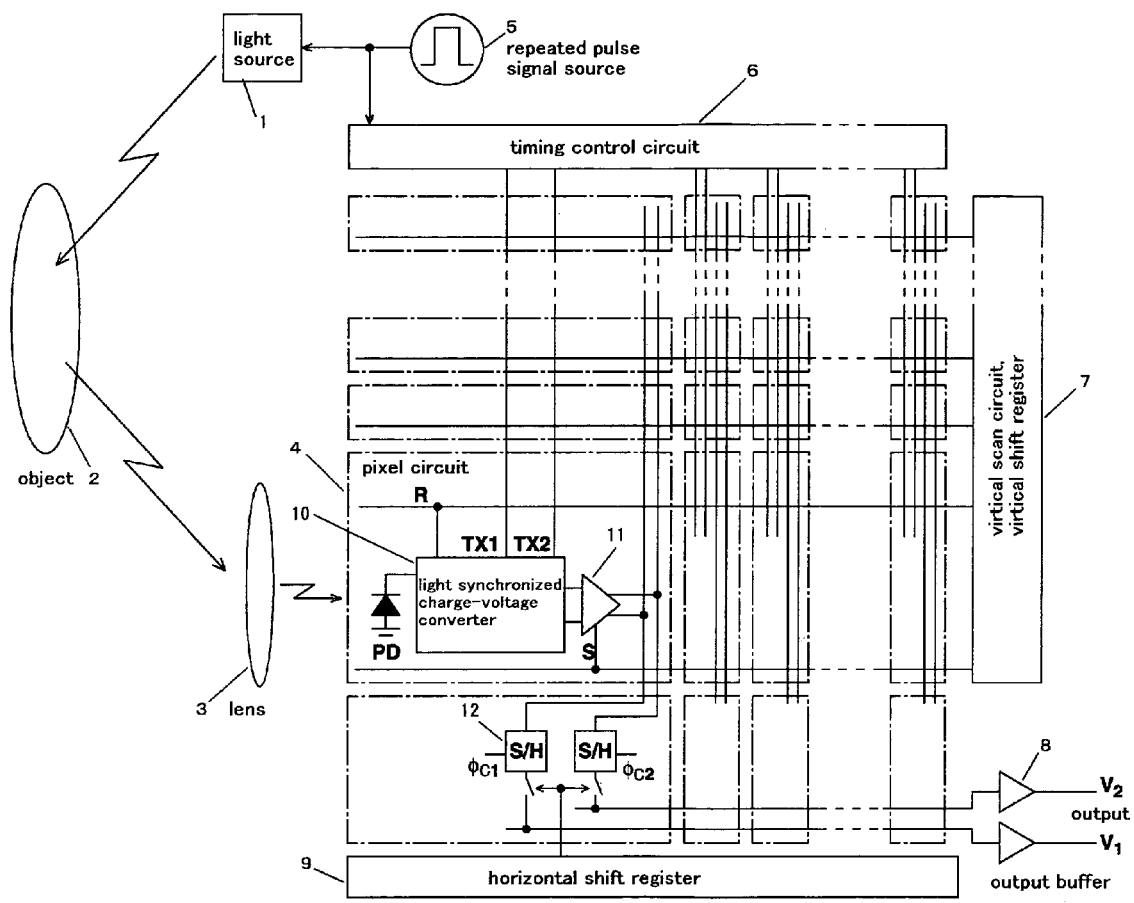
FIG. 1 is a block diagram depicting a TOF distance measuring sensor.

To read the signals, in the case of FIG. 1, the buffer select signal S for the pixel section of the row to be read is supplied, the signals in the two charge storage nodes are sampled in the sample & hold circuit (S/H) created in the column reads circuit using $\phi$c1 and $\phi$c2, and are stored. One row of signals stored in the S/H circuit (12) of the column are sequentially selected by horizontal scanning (9), and are output as time series signals. At this time, in the sample & hold circuit in the column, the signals when the reset signal $\phi$R of the pixel section is supplied may also be read, so that the signal which cancelled the fixed pattern noise generated by the source follower of the pixels is stored, and this is read by horizontal scanning.

In the case of FIG. 9, the buffer select signal S of the pixel section of the row to be read is supplied. Then when $\phi$1 is supplied to the pixel section, the signal stored in the capacitor C1 in the pixel is output from the pixel section, and this signal is sampled in the S/H circuit arrayed in columns using the control signal $\phi$c1, and is stored. Then when $\phi$2 is supplied to the pixel section, the signal stored in the capacitor C2 in the pixel is output from the pixel section, and this signal is sampled in the S/H circuit arrayed in columns using the control signal $\phi$c2, and is stored. One line of signals stored in the S/H circuit in columns are sequentially selected by horizontal scanning, and are output as time series signals. In this case as well, the signal when the reset signal R of the pixel section is supplied may also be read, so that the signal which cancelled the fixed pattern noise generated by the source follower of the pixel is stored, and this is read by horizontal scanning.

Figure 19:
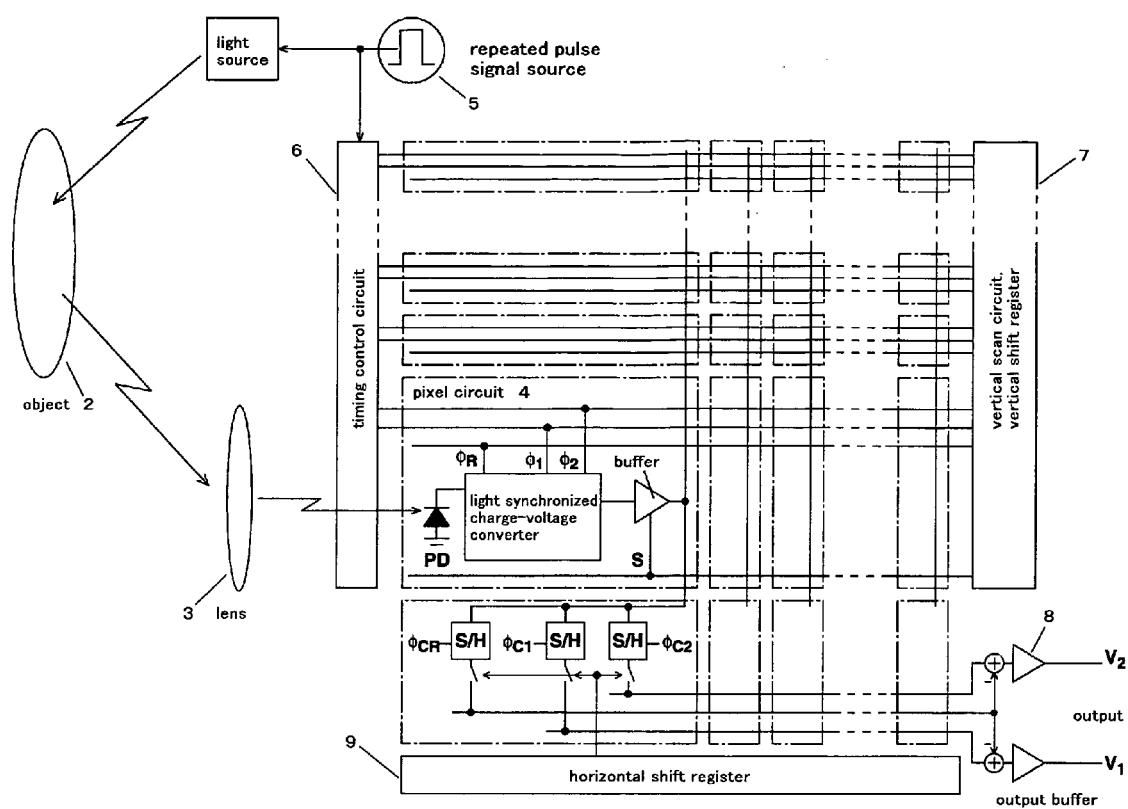
FIG. 19 is a block diagram depicting the case when the charge transfer control signal is supplied in a horizontal direction.

In FIG. 9, the signals $\phi$1 and $\phi$2 are supplied vertically, but as FIG. 19 shows, the timing control circuit may be disposed vertically and provide the signals $\phi$1 and $\phi$2 horizontally. In this case, when a signal is read, only $\phi$1 and $\phi$2 of a row to be read can be operated. This may cancel the noise generated by the pixel section more effectively. As a method of noise cancellation, in FIG. 19, the S/H circuits for storing the value which reset the pixel section may be disposed so that the reset level is sampled by $\phi$CR, and the difference between this output and the signals of the output of the two S/H circuits which read the signals stored in C1 and C2 of the pixel section is determined, just before final output, to cancel noise.

INDUSTRIAL APPLICABILITY

By this configuration, the sensitivity improves and the influence of the background light and the dark current can be removed, so the image sensor for distance measurement using the flight velocity of the light can be used in an ordinary environment. Also the brightness image signal can be acquired along with the distance image information.

The invention claimed is:

1. A distance image sensor for projecting light from a light source to an object intermittently and measuring the distance by the delay time of the reflected light thereof, comprising:
   a photo-detector (PD) having a photo-diode structure buried in a semiconductor substrate for converting reflected light from an object into charges;
   a plurality of gate means (G1, G2) having an MOS (Metal Oxide Semiconductor) structure on a semiconductor substrate;
   a plurality of charge storage nodes (C1, C2); and
   control means (6) for controlling the switching of said gate means, wherein
   at least two of said charge storage nodes, that is a first charge storage node and a second charge storage node, charges from said photo-detector are alternately transferred and stored, synchronizing the light intermittent operation from said light source, by said gate means, that is a first gate means and a second gate means, so that the charge transfer efficiency from said photo-detector is improved and the distance to the object is determined using the distribution ratio of the stored charges.

2. The distance image sensor according to claim 1, further comprising a third gate (G3) means in a third charge storage node (C3), wherein when reflected light by projected light does not exist, charges by background light are transferred to said third charge storage node by opening said third gate means, so that the charges are stored in said third charge storage node for removing background light.

3. The distance image sensor according to claim 1, further comprising sampling & hold means corresponding to each of said charge storage nodes.

4. A distance image sensor for projecting light from a light source to an object intermittently and measuring the distance by the delay time of the reflected light thereof, comprising:
   a photo-detector for converting reflected light from an object into charges;
   an inversion amplifier to which signal charges from said photo-detector are input;
   a first serial circuit further comprising a first capacitor (C1) and first switching means ($\Phi$1) connected to said first capacitor in series;
   a second serial circuit further comprising a second capacitor (C2) and second switching means ($\Phi$2) connected to said second capacitor in series; and
   control means (6) for controlling the switching of said first and second switching means, wherein
   said first serial circuit is connected between the output and the input of said inversion amplifier, and said second serial circuit is connected between the output and the input of said inversion amplifier to construct a negative feedback amplifier, signal charges which depend on the delay time of the reflected light from an object are distributed to said first capacitor and said second capacitor by switching of said first and second switching means, so that the charge transfer efficiency from said photo-detector is improved and information on distance to the object is acquired from the charges stored in said first and second capacitors.

5. The distance image sensor according to claim 4, further comprising a third serial circuit which comprises a third capacitor (C3) and third switching means ($\Phi$3) connected to said third capacitor in series, wherein charges by background light are transferred to said third capacitor by closing said third switching means when the reflected light by the projected light does not exist, so that the charges are stored in said third capacitor for removing the background light.

6. A distance image sensor for projecting light from a light source to an object intermittently and measuring the distance by the delay time of the reflected light thereof, comprising:
- a photo-detector for converting reflected light from an object into charges;
- an inversion amplifier to which signal charges from said photo-detector are input;
- a first serial circuit further comprising a first capacitor (C1) and first switching means (Φ1) connected to said first capacitor in series;
- a second serial circuit further comprising a second capacitor (C2) and second switching means (Φ2) connected to said second capacitor in series;
- control means (6) for controlling the switching of said first and second switching means, wherein
- said first serial circuit is connected between the output and the input of said inversion amplifier, and said second serial circuit is connected between the output and the input of said inversion amplifier to construct a negative feedback amplifier, signal charges which depend on the delay time of the reflected light from an object are distributed to said first capacitor and said second capacitor by switching of said first and second switching means, so that the charge transfer efficiency from said photo-detector is improved and information on distance to the object is acquired from the charges stored in said first and second capacitors and
- wherein the r (r=1, 2, . . . n)-th capacitor for holding is connected to the output of said inversion amplifier via the r-th gate, the charges stored in said r-th capacitor are transferred to said r-th capacitor for holding by opening said r-th gate corresponding to the closing of said r-th switching means, and sampling & holding operation of charges is performed, so that calculation is enabled for all the pixels simultaneously.

7. The distance image sensor according to claim 1, wherein a brightness image signal is acquired from the sum of the charges stored in said first and second capacitors or storage nodes, the sum of charges stored in said first to third capacitors or storage nodes, or charges stored in said third capacitor or storage node.

8. A distance image sensor for projecting light from a light source to an object intermittently and measuring the distance by the delay time of the reflected light thereof, comprising:
- a photo-detector (PD) having a photo-diode structure buried in a semiconductor substrate for converting reflected light from an object into charges;
- a plurality of gate means (G1, G2) having an MOS (Metal Oxide Semiconductor) structure on a semiconductor substrate;
- a plurality of charge storage nodes (C1, C2);
- control means (6) for controlling the switching of said gate means, wherein
- at least two of said charge storage nodes, that is a first charge storage node and a second charge storage node, charges from said photo-detector are alternately transferred and stored, synchronizing the light intermittent operation from said light source, by said gate means, that is a first gate means and a second gate means, so that the charge transfer efficiency from said photo-detector is improved and the distance to the object is determined using the distribution ratio of the stored charges and
- voltage control delay means for passing signals for controlling the switching of said first and second gate means or switching means, wherein a signal based on the difference of the charges stored in said storage node or capacitor is supplied to said voltage control delay means as a control signal with polarity where said difference of charges approaches zero, so as to form a negative feedback loop.

9. The distance image sensor according to claim 1, wherein the pulse width for receiving the projection light, that is the period when said gate is open, or the period when said switching means is closed, is sufficiently short with respect to the repeat cycle.

10. The distance image sensor according to claim 9, comprising reset means for clearing the charges by the background light synchronizing each cycle of the repeat cycle of the projection light.

11. The distance image sensor according to claim 1, wherein said control means controls said gate means or switching means so that the charges at the moment when the reflected light rises are stored in said first charge storage node or capacitor, and charges after reflected light is at a stable level are stored in said second charge storage node or capacitor.

12. The distance image sensor according to claim 4, wherein a brightness image signal is acquired from the sum of the charges stored in said first and second capacitors or storage nodes, the sum of charges stored in said first to third capacitors or storage nodes, or charges stored in said third capacitor or storage node.

13. A distance image sensor for projecting light from a light source to an object intermittently and measuring the distance by the delay time of the reflected light thereof, comprising:
- a photo-detector for converting reflected light from an object into charges;
- an inversion amplifier to which signal charges from said photo-detector are input;
- a first serial circuit further comprising a first capacitor (C1) and first switching means (Φ1) connected to said first capacitor in series;
- a second serial circuit further comprising a second capacitor (C2) and second switching means (Φ1) connected to said second capacitor in series;
- control means (6) for controlling the switching of said first and second switching means, wherein
- said first serial circuit is connected between the output and the input of said inversion amplifier, and said second serial circuit is connected between the output and the input of said inversion amplifier to construct a negative feedback amplifier, signal charges which depend on the delay time of the reflected light from an object are distributed to said first capacitor and said second capacitor by switching of said first and second switching means, so that the charge transfer efficiency from said photo-detector is improved and information on distance to the object is acquired from the charges stored in said first and second capacitors and
- voltage control delay means for passing signals for controlling the switching of said first and second gate means or switching means, wherein a signal based on the difference of the charges stored in said storage node or capacitor is supplied to said voltage control delay means as a control signal with polarity where said difference of charges approaches zero, so as to form a negative feedback loop.

14. The distance image sensor according to claim 4, wherein the pulse width for receiving the projection light, that is the period when said gate is open, or the period when said switching means is closed, is sufficiently short with respect to the repeat cycle.

15. The distance image sensor according to claim 14, comprising reset means for clearing the charges by the background light synchronizing each cycle of the repeat cycle of the projection light.

16. The distance image sensor according to claim 4, wherein said control means controls said gate means or switching means so that the charges at the moment when the reflected light rises are stored in said first charge storage node or capacitor, and charges after reflected light is at a stable level are stored in said second charge storage node or capacitor.

* * * * *